(12) United States Patent
Koch et al.

(10) Patent No.: US 7,815,849 B2
(45) Date of Patent: Oct. 19, 2010

(54) DOPED IRIDIUM WITH IMPROVED HIGH-TEMPERATURE PROPERTIES

(75) Inventors: Michael Koch, Bruchkoebel (DE); David Francis Lupton, Geinhausen (DE); Harald Manhardt, Bruchkoebel (DE); Tobias Mueller, Gelnhausen (DE); Reinhold Weiland, Rodenbach (DE); Bernd Fischer, Jena (DE)

(73) Assignee: W.C. Heraeus GmbH, Hanau (DE)

( * ) Notice: Subject to any disclaimer, the term of this patent is extended or adjusted under 35 U.S.C. 154(b) by 404 days.

(21) Appl. No.: 11/995,331

(22) PCT Filed: Jul. 7, 2006

(86) PCT No.: PCT/EP2006/006684

§ 371 (c)(1),
(2), (4) Date: Jan. 11, 2008

(87) PCT Pub. No.: WO2007/006513

PCT Pub. Date: Jan. 18, 2007

(65) Prior Publication Data

US 2008/0213123 A1    Sep. 4, 2008

(30) Foreign Application Priority Data

Jul. 11, 2005 (DE) .......................... 10 2005 032 591

(51) Int. Cl.
*C22C 5/00* (2006.01)

(52) U.S. Cl. .................. 420/461; 148/678; 148/430; 117/900

(58) Field of Classification Search ................ 420/461; 148/407, 678, 430; 117/900
See application file for complete search history.

(56) References Cited

U.S. PATENT DOCUMENTS 3,918,965 A    11/1975    Inouye et al.
4,444,728 A    4/1984    Lanam et al.

FOREIGN PATENT DOCUMENTS

JP    10-259435 A    9/1998
WO    2004/007782 A1    1/2004

OTHER PUBLICATIONS

Machine-English translation of Japanese patent 10-259435, Furuya Kinzoku et al., Sep. 29, 1998.*

* cited by examiner

*Primary Examiner*—Deborah Yee
(74) *Attorney, Agent, or Firm*—Panitch Schwarze Belisario & Nadel LLP

(57) ABSTRACT

An iridium alloy is produced having at least 85% by weight iridium, at least 0.005% by weight molybdenum, 0.001 to 0.6% by weight hafnium and, optionally, rhenium, the sum of molybdenum and hafnium being between 0.002 and 1.2% by weight. The iridium alloy is produced in a process, in which an IrMo and an IrHf master alloy, respectively, are created in an electric arc and immersed into an iridium melt, optionally together with Re.

9 Claims, No Drawings

DOPED IRIDIUM WITH IMPROVED HIGH-TEMPERATURE PROPERTIES

CROSS-REFERENCE TO RELATED APPLICATIONS

This application is a Section 371 of International Application No. PCT/EP2006/006684, filed Jul. 7, 2006, which was published in the German language on Jan. 18, 2007, under International Publication No. WO 2007/006513 A1 and the disclosure of which is incorporated herein by reference.

BACKGROUND OF THE INVENTION

The present invention relates to doping of iridium or iridium rhenium alloys with molybdenum and hafnium.

International patent application publication No. WO 2004/007782 mentions crucibles for crystal growing as one of many applications for iridium. Iridium alloys containing tungsten and/or zirconium are described, which additionally contain 0.01 to 0.5% by weight of further elements such as molybdenum and hafnium and, optionally, contain ruthenium in a quantity of 0.01 to 10% by weight. In this document, it is also mentioned that the addition of these additional elements, as such, alone is not effective.

U.S. Pat. No. 4,444,728 describes iridium rhenium crucibles with a rhenium content of 1 to 15% by weight.

According to U.S. Pat. No. 3,918,965, the mechanical properties of iridium are greatly improved by doping with 0.65 to 0.93% by weight of hafnium.

BRIEF SUMMARY OF THE INVENTION

An object of the present invention is to improve the creep strength and creep resistance, improve the behaviour under mechanical stress and reduce the formation of coarse grain during recrystallization, based on excellent corrosion resistance of iridium vis-à-vis oxidic melts.

This task is achieved by iridium alloys of at least 85% by weight iridium, at least 0.005% by weight molybdenum, 0.0005 to 0.6% y weight hafnium and, optionally, rhenium, the sum of molybdenum and hafnium being between 0.002 and 1.2% by weight.

To increase the creep resistance at 1800° C., doping of iridium or iridium rhenium alloy with at least 50 ppm of molybdenum and at least 5 ppm of hafnium takes place, the sum of molybdenum and hafnium being between 200 ppm and 1.2% by weight, in particular between 0.02 and 0.7% by weight.

In a preferred embodiment, the proportion of molybdenum amounts to 0.01 to 0.8% by weight, in particular 0.02 to 0.3% by weight of molybdenum, and the proportion of hafnium amounts to 0.001 to 0.4% by weight, in particular 0.01 to 0.2% by weight of hafnium.

As a result, the formation of coarse grain during recrystallization is markedly slowed down, and the creep strength and creep resistance are improved. This doped iridium exhibits a clearly improved behavior under mechanical stress vis-à-vis oxidic melts.

The same components lead to even more effective results regarding reduced coarse grain formation by recrystallization and high temperature resistance in iridium rhenium alloys having at least 85% by weight of Ir, preferably having up to 8% by weight of rhenium, in particular 0.1 to 5% by weight of Re. In addition, the tendency towards the formation of contraction cavities is considerably reduced.

In a further preferred embodiment, the weight ratio of molybdenum to hafnium is between 3:1 and 1:1, in particular between 2.5:1 and 1.5:1.

DETAILED DESCRIPTION OF THE INVENTION

For the production of the alloys according to the invention, it has proved suitable to produce IrMo and IrHf master (intermediate) alloys in the electric arc. These master alloys are introduced into an iridium melt in a ratio to the target alloy and/or an iridium melt is cast over them. Additionally, Re can be introduced into the Ir melt.

The invention is illustrated in the following by way of examples:

1. Iridium doped with 0.05% by weight of molybdenum is improved regarding its creep resistance at 1800° C. by doping with 0.001% by weight of hafnium. This improvement occurs most markedly by doping with Hf of between 0.01 and 0.1% by weight. By doping with more than 0.5% by weight of Hf, the processability of the alloy becomes more difficult.

2. Iridium doped with 0.3% by weight of hafnium exhibits an increase in the creep resistance at 1800° C. by doping with 0.01% by weight of molybdenum. The creep resistance is further considerably improved by doping with Mo in the region between 0.02 and 0.3% by weight. By doping with more than 0.8% by weight of Mo, the processability of the alloy becomes more difficult.

3. If, in the examples described above, an iridium rhenium alloy with 0.1% by weight of rhenium, 1% by weight of rhenium and 8% by weight of rhenium is used instead of an iridium rhenium alloy, a further improvement in the high temperature resistance can be ascertained with a simultaneous reduction in the tendency towards contraction cavity formation, the best results having been achieved with 1% by weight of rhenium. By doping with more than 8% by weight of rhenium, the processability of the alloy becomes difficult.

PRACTICAL EXAMPLES

Iridium alloys according to the invention can be obtained by melting master alloys with Ir.

An Ir Hf 1 and an Ir Mo 1 master alloy is produced in an electric arc.

A melting process takes place in this case in an electric arc facility with a W electrode after:
  weighing in 99 g of Ir and 1 g of Hf
  charging a water-cooled Cu chill mold
  evacuating
  flooding with 300 mbar of argon
  igniting the electric arc and melting of the alloy
  repeated remelting in order to obtain a homogeneous alloy.
  This process is repeated correspondingly for Ir Mo 1.

During the production process of the alloy melt, Re is added, optionally, and the two master alloys are immersed into the Ir melt in order to prevent oxidation of the alloy components. For this purpose, the master alloys are passed into the iridium melt using a rod of zirconium oxide and prevented from emerging.

Example 1

3 kg of an alloy of Ir-1% Re-0.04% Mo-0.02% Hf were inductively melted under an argon atmosphere and cast into a copper chill mold of 20 mm×70 mm×100 mm according to usual practice. A conspicuous feature of the ingot was the more reduced formation of contraction cavities than is usually observed in the case of pure iridium. The ingots were hot forged according to normal practice and hot rolled to a thickness of 1 mm, the ingot being heated to 1400° C. before each fore plate. During hot forming, the alloy behaved satisfactorily, similar to pure iridium. Analogous to pure iridium, final annealing takes place after forming for 20 minutes/1400° C. A metallographic section investigation showed a uniform recrystallized structure with an average grain size of 0.095 mm.

From this alloyed Ir sheet, a sample was cut and stored for 100 hours at 1400° C. A uniform recrystallized structure with an average grain size of 0.11 mm was determined in the metallographic section.

From the same alloyed Ir sheet, 3 samples were cut for creep tests. These samples were tested at 1800° C. under a load of 16.9 MPa—corresponding to the load which had given a service life of 10.0 hours for pure iridium—under an atmosphere of $Ar/H_2$ 95/5. The time up to rupture of the individual samples was 15.4, 16.6 and 18.8 hours, respectively.

A further ingot with the same alloy composition was melted and formed into a sheet 2.4 mm thick. From this sheet, a cylindrical crucible with an outside diameter of 50 mm and a height of 60 mm was produced by hot deep-drawing. During forming, the alloy behaved in a manner analogous to pure Ir.

Using this crucible, a single crystal of neodymium yttrium aluminum garnet was grown according to the Czochralski method.

Example 2

In an analogous manner, an ingot of the alloy Ir-0.3% Mo-0.04% Hf was melted, cast and formed into a 1 mm sheet. After final annealing, the sheet had an even recrystallized structure with an average grain size of 0.3 mm.

Following additional test annealing for 100 hours at 1400° C., an even recrystallized structure with an average grain size of 0.6 mm was determined.

During the creep test at 1800° C. under a load of 16.9 MPa, service lives of 12.0, 16.6 and 13.1 hours, respectively, were measured.

Example 3

In an analogous manner, an ingot of the alloy Ir-3% Re-0.05% Mo-0.03% Hf was melted, cast and formed into a 1 mm sheet. After final annealing, the sheet had a homogeneous recrystallized structure with an average grain size of 0.075 mm.

After additional experimental annealing for 100 hours at 1400° C., a homogenously recrystallized structure with an average grain size of 0.09 mm was determined.

During the creep test at 1800° C. under a load of 16.9 MPa, service lives of 18.1, 19.7 and 20.9 hours, respectively, were measured on 3 samples.

A further ingot with the same alloy composition was melted and formed into a sheet 2.4 mm thick. From this sheet, a cylindrical crucible with an outside diameter of 30 mm and a height of 35 mm was made by hot deep-drawing. During forming, a higher application of force was necessary than in the case of pure iridium. Also, the crucible had to be subjected more frequently to intermediate annealing (10 minutes/1400° C.) than is the rule with pure iridium. Otherwise, the formation was problem-free.

Using this crucible, a single crystal of sapphire was grown from an aluminum oxide melt according to the Czochralski method.

Comparative Examples

A sample of a sheet of pure iridium 1 mm thick was examined in the metallographic section after rolling and final annealing for 20 minutes/1400° C. The sample exhibited a homogeneous recrystallized structure with an average grain size of 0.7 mm.

A further sample of the same Ir sheet was stored after final annealing for a further 100 hours at 1400° C. and examined metallographically. The sample exhibited a recrystallized structure with a partial coarse grain formation. The grain size was uneven between 1 and 2 mm.

10 samples of the same Ir sheet were subjected, after final annealing, to different loads of between 6 and 25 MPa at 1800° C. under an atmosphere of $Ar/H_2$ 95/5, and the time up to rupture of the individual samples was determined. For a load of 16.9 MPa, a service life of 10.0 hours was determined up to rupture.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An iridium alloy having improved creep resistance at 1800° C. and consisting essentially of at least 85% by weight iridium, at least 0.005% by weight molybdenum, 0.0005 to 0.6% by weight hafnium, and 0.1 to 5% by weight rhenium, the molybdenum and hafnium being present in the alloy in a total amount between 0.002 and 1.2% by weight.

2. The iridium alloy according to claim 1, consisting essentially of at least 85% by weight iridium, 0.1 to 5% by weight rhenium, 0.01 to 0.8% by weight molybdenum and 0.002 to 0.4% by weight hafnium.

3. The iridium alloy according to claim 1, wherein the amount of molybdenum is 0.02 to 0.3% by weight.

4. The iridium alloy according to claim 1, wherein the amount of hafnium is 0.002 to 0.2% by weight.

5. A process for production of the iridium alloy according to claim 1, comprising producing a master alloy of Ir Mo and a master alloy of Ir Hf in an electric arc and immersing each of the master alloys into an iridium melt, with Re.

6. A crucible, bath or glass working tool comprising the iridium alloy according to claim 1.

7. A method for growing crystals of high melting oxidic melts, wherein the crystals are grown in a crucible according to claim 6.

8. The method according to claim 7, wherein the crystals are selected from aluminium oxide and neodymium yttrium aluminum garnet.

9. A method for manufacturing high melting of glass, wherein the manufacturing takes place in the crucible, bath or glass processing tool according to claim 6.

* * * * *

UNITED STATES PATENT AND TRADEMARK OFFICE
CERTIFICATE OF CORRECTION

Page 1 of 1

PATENT NO. : 7,815,849 B2
APPLICATION NO. : 11/995331
DATED : October 19, 2010
INVENTOR(S) : Michael Koch et al.

It is certified that error appears in the above-identified patent and that said Letters Patent is hereby corrected as shown below:

Title Page, Section (57):
In fourth line of Abstract: "0.002" should read -- 0.02 --;

Column 1, line 43:
"0.002" should read -- 0.02 --;

Column 4, line 37:
"0.002" should read -- 0.02 --.

Signed and Sealed this
Twenty-eighth Day of June, 2011

David J. Kappos
*Director of the United States Patent and Trademark Office*